United States Patent
Lotfi et al.

(10) Patent No.: US 9,054,086 B2
(45) Date of Patent: *Jun. 9, 2015

(54) MODULE HAVING A STACKED PASSIVE ELEMENT AND METHOD OF FORMING THE SAME

(75) Inventors: Ashraf W. Lotfi, Bridgewater, NJ (US); Douglas Dean Lopata, Boyertown, PA (US); John David Weld, Ledgewood, NJ (US); Mathew A. Wilkowski, Nazareth, PA (US)

(73) Assignee: Enpirion, Inc., Hampton, NJ (US)

( * ) Notice: Subject to any disclaimer, the term of this patent is extended or adjusted under 35 U.S.C. 154(b) by 31 days.

This patent is subject to a terminal disclaimer.

(21) Appl. No.: 12/244,669

(22) Filed: Oct. 2, 2008

(65) Prior Publication Data

US 2010/0084750 A1    Apr. 8, 2010

(51) Int. Cl.
*H01L 23/495*    (2006.01)
*H01L 51/52*    (2006.01)
(Continued)

(52) U.S. Cl.
CPC ............ *H01L 23/495* (2013.01); *H01L 51/529* (2013.01); *H01F 17/0006* (2013.01); *H01F 27/22* (2013.01); *H01L 23/4952* (2013.01); *H01L 24/05* (2013.01); *H01L 24/06* (2013.01); *H01L 24/45* (2013.01); *H01L 24/49* (2013.01); *H01L 2224/05555* (2013.01); *H01L 2224/05556* (2013.01); *H01L 2224/05599* (2013.01); *H01L 2224/32245* (2013.01); *H01L 2224/45144* (2013.01); *H01L 2224/45147* (2013.01); *H01L 2224/48095* (2013.01); *H01L 2224/48247* (2013.01); *H01L 2224/48465* (2013.01); *H01L 2224/49* (2013.01); *H01L 2224/73265* (2013.01);

(Continued)

(58) Field of Classification Search
CPC ....................................................... H01L 51/529
USPC ................................................. 257/621, 693
See application file for complete search history.

(56) References Cited

U.S. PATENT DOCUMENTS 1,889,398 A    11/1932  Bishop
2,600,473 A     6/1952  Brockman
(Continued)

FOREIGN PATENT DOCUMENTS

DE    10022980 A1    12/2000
GB    2 041 818 A     9/1980
(Continued)

OTHER PUBLICATIONS

Betancourt-Zamora, R.J., et al., "A 1.5 mW, 200 MHz CMOS VCO for Wireless Biotelemetry," First International Workshop on Design of Mixed-Mode Integrated Circuits and Applications, Jul. 1997, pp. 72-74, Cancun, Mexico.

(Continued)

*Primary Examiner* — Zandra Smith
*Assistant Examiner* — Mohammad Choudhry
(74) *Attorney, Agent, or Firm* — Boisbrun Hofman, PLLC

(57) ABSTRACT

A module having a discrete passive element and a semiconductor device, and method of forming the same. In one embodiment, the module includes a patterned leadframe, a discrete passive element mounted on an upper surface of the leadframe, and a thermally conductive, electrically insulating material formed on an upper surface of the discrete passive element. The module also includes a semiconductor device bonded to an upper surface of the thermally conductive, electrically insulating material.

20 Claims, 8 Drawing Sheets

(51) Int. Cl.
*H01F 17/00* (2006.01)
*H01F 27/22* (2006.01)
*H01L 23/00* (2006.01)

(52) U.S. Cl.
CPC .............. *H01L 2224/85399* (2013.01); *H01L 2924/01013* (2013.01); *H01L 2924/01015* (2013.01); *H01L 2924/01027* (2013.01); *H01L 2924/01028* (2013.01); *H01L 2924/01029* (2013.01); *H01L 2924/01047* (2013.01); *H01L 2924/0105* (2013.01); *H01L 2924/01074* (2013.01); *H01L 2924/01079* (2013.01); *H01L 2924/01082* (2013.01); *H01L 2924/01327* (2013.01); *H01L 2924/014* (2013.01); *H01L 2924/14* (2013.01); *H01L 2924/19041* (2013.01); *H01L 2924/19042* (2013.01); *H01L 2924/19043* (2013.01); *H01L 24/48* (2013.01); *H01L 2924/01006* (2013.01); *H01L 2924/01033* (2013.01); *H01L 2924/00014* (2013.01); *H01L 2224/48599* (2013.01); *H01L 2224/48799* (2013.01); *H01L 2224/49113* (2013.01)

(56) References Cited

U.S. PATENT DOCUMENTS

| | | |
|---|---|---|
| 3,210,707 A | 10/1965 | Constantakes |
| 3,691,497 A | 9/1972 | Bailey et al. |
| 3,762,039 A | 10/1973 | Douglass et al. |
| 3,902,148 A | 8/1975 | Drees et al. |
| 3,908,264 A | 9/1975 | Friberg et al. |
| 3,947,699 A | 3/1976 | Whitmer |
| 4,101,389 A | 7/1978 | Uedaira |
| 4,103,267 A | 7/1978 | Olschewski |
| 4,187,128 A | 2/1980 | Billings et al. |
| 4,199,743 A | 4/1980 | Martincic |
| 4,349,862 A | 9/1982 | Bajorek et al. |
| 4,433,927 A | 2/1984 | Cavallari |
| 4,455,545 A | 6/1984 | Shelly |
| 4,586,436 A | 5/1986 | Denney et al. |
| 4,636,752 A | 1/1987 | Saito |
| 4,668,310 A | 5/1987 | Kudo et al. |
| 4,681,718 A | 7/1987 | Oldham |
| 4,751,199 A | 6/1988 | Phy |
| 4,754,317 A | 6/1988 | Comstock et al. |
| 4,777,465 A | 10/1988 | Meinel |
| 4,808,118 A | 2/1989 | Wilson et al. |
| 4,847,986 A | 7/1989 | Meinel |
| 4,870,224 A | 9/1989 | Smith et al. |
| 4,878,291 A | 11/1989 | Suguri |
| 4,916,522 A | 4/1990 | Cohn |
| 4,967,156 A | 10/1990 | Seitz |
| 4,975,671 A | 12/1990 | Dirks |
| 5,056,214 A | 10/1991 | Holt |
| 5,059,278 A | 10/1991 | Cohen et al. |
| 5,096,513 A | 3/1992 | Sawa et al. |
| 5,118,298 A | 6/1992 | Murphy |
| 5,156,989 A | 10/1992 | Williams et al. |
| 5,161,098 A | 11/1992 | Balakrishnan |
| 5,187,119 A | 2/1993 | Cech et al. |
| 5,262,296 A | 11/1993 | Ogawa et al. |
| 5,279,988 A | 1/1994 | Saadat et al. |
| 5,285,369 A | 2/1994 | Balakrishnan |
| 5,345,670 A | 9/1994 | Pitzele et al. |
| 5,353,001 A | 10/1994 | Meinel et al. |
| 5,428,245 A | 6/1995 | Lin et al. |
| 5,430,613 A | 7/1995 | Hastings et al. |
| 5,436,409 A | 7/1995 | Sawada et al. |
| 5,469,334 A | 11/1995 | Balakrishnan |
| 5,484,494 A | 1/1996 | Oda et al. |
| 5,524,334 A | 6/1996 | Boesel |
| 5,543,773 A | 8/1996 | Evans et al. |
| 5,561,438 A | 10/1996 | Nakazawa et al. |
| 5,574,273 A | 11/1996 | Nakagawa et al. |
| 5,574,420 A | 11/1996 | Roy et al. |
| 5,578,261 A | 11/1996 | Manzione et al. |
| 5,692,296 A | 12/1997 | Variot |
| 5,751,528 A | 5/1998 | Nepela et al. |
| 5,783,025 A | 7/1998 | Hwang et al. |
| 5,787,569 A | 8/1998 | Lotfi et al. |
| 5,788,854 A | 8/1998 | Desaigoudar et al. |
| 5,802,702 A | 9/1998 | Fleming et al. |
| 5,807,959 A | 9/1998 | Wu et al. |
| 5,834,691 A | 11/1998 | Aoki |
| 5,835,350 A | 11/1998 | Stevens |
| 5,837,155 A | 11/1998 | Inagaki et al. |
| 5,846,441 A | 12/1998 | Roh |
| 5,898,991 A | 5/1999 | Fogel et al. |
| 5,920,249 A | 7/1999 | Huss |
| 5,973,923 A | 10/1999 | Jitaru |
| 5,998,925 A | 12/1999 | Shimizu et al. |
| 6,005,377 A | 12/1999 | Chen et al. |
| 6,005,467 A | 12/1999 | Abramov |
| 6,060,176 A | 5/2000 | Semkow et al. |
| 6,081,997 A * | 7/2000 | Chia et al. .................. 29/841 |
| 6,087,920 A | 7/2000 | Abramov |
| 6,087,921 A | 7/2000 | Morrison |
| 6,094,123 A | 7/2000 | Roy |
| 6,101,218 A | 8/2000 | Nagano |
| 6,118,351 A | 9/2000 | Kossives et al. |
| 6,118,360 A | 9/2000 | Neff |
| 6,143,157 A | 11/2000 | Andrus et al. |
| 6,160,721 A | 12/2000 | Kossives et al. |
| 6,165,340 A | 12/2000 | Andrus et al. |
| 6,246,311 B1 | 6/2001 | Finnemore et al. |
| 6,255,714 B1 | 7/2001 | Kossives et al. |
| 6,317,948 B1 | 11/2001 | Kola et al. |
| 6,353,379 B1 | 3/2002 | Busletta et al. |
| 6,362,714 B1 | 3/2002 | Rice et al. |
| 6,366,486 B1 | 4/2002 | Chen et al. |
| 6,384,706 B1 | 5/2002 | Iwanami |
| 6,440,750 B1 | 8/2002 | Feygenson et al. |
| 6,448,640 B2 | 9/2002 | Corisis |
| 6,466,454 B1 | 10/2002 | Jitaru |
| 6,479,981 B2 | 11/2002 | Schweitzer, Jr. et al. |
| 6,495,019 B1 | 12/2002 | Filas et al. |
| 6,541,819 B2 | 4/2003 | Lotfi et al. |
| 6,549,409 B1 | 4/2003 | Saxelby, Jr. et al. |
| 6,552,629 B2 | 4/2003 | Dixon et al. |
| 6,560,860 B2 | 5/2003 | Shepherd |
| 6,578,253 B1 | 6/2003 | Herbert |
| 6,608,332 B2 | 8/2003 | Shimizu et al. |
| 6,621,137 B1 | 9/2003 | Ma et al. |
| 6,624,498 B2 | 9/2003 | Filas et al. |
| 6,649,422 B2 | 11/2003 | Kossives et al. |
| 6,691,398 B2 | 2/2004 | Gutierrez |
| 6,693,805 B1 | 2/2004 | Steigerwald et al. |
| 6,731,002 B2 | 5/2004 | Choi |
| 6,747,538 B2 | 6/2004 | Kuwata et al. |
| 6,750,403 B2 | 6/2004 | Peterson |
| 6,775,901 B1 | 8/2004 | Lee et al. |
| 6,790,379 B2 | 9/2004 | Aoki et al. |
| 6,912,781 B2 | 7/2005 | Morrison et al. |
| 6,922,130 B2 | 7/2005 | Okamoto |
| 6,989,121 B2 | 1/2006 | Thummel |
| 6,998,952 B2 | 2/2006 | Zhou et al. |
| 6,998,953 B2 | 2/2006 | Yeo et al. |
| 7,009,486 B1 | 3/2006 | Goeke et al. |
| 7,015,544 B2 | 3/2006 | Lotfi et al. |
| 7,019,505 B2 | 3/2006 | Dwarakanath et al. |
| 7,020,295 B2 | 3/2006 | Hamada et al. |
| 7,021,518 B2 | 4/2006 | Kossives et al. |
| 7,023,315 B2 | 4/2006 | Yeo et al. |
| 7,038,438 B2 | 5/2006 | Dwarakanath et al. |
| 7,057,486 B2 | 6/2006 | Kiko |
| 7,101,737 B2 | 9/2006 | Cobbley |
| 7,151,228 B2 | 12/2006 | Takase et al. |
| 7,157,984 B2 | 1/2007 | McCorquodale et al. |
| 7,175,718 B2 | 2/2007 | Nobutoki et al. |
| 7,180,395 B2 | 2/2007 | Lotfi et al. |
| 7,183,622 B2 | 2/2007 | Heck et al. |
| 7,188,530 B2 | 3/2007 | Pedersen et al. |
| 7,214,985 B2 | 5/2007 | Lotfi et al. |

(56) References Cited

U.S. PATENT DOCUMENTS

| | | | |
|---|---|---|---|
| 7,229,886 B2 | 6/2007 | Lotfi et al. | |
| 7,230,302 B2 | 6/2007 | Lotfi et al. | |
| 7,230,316 B2 | 6/2007 | Yamazaki et al. | |
| 7,232,733 B2 | 6/2007 | Lotfi et al. | |
| 7,236,086 B1 | 6/2007 | Vinciarelli et al. | |
| 7,244,994 B2 | 7/2007 | Lotfi et al. | |
| 7,250,842 B1 | 7/2007 | Johnson et al. | |
| 7,256,674 B2 | 8/2007 | Lotfi et al. | |
| 7,276,998 B2 | 10/2007 | Lotfi et al. | |
| 7,330,017 B2 | 2/2008 | Dwarakanath et al. | |
| 7,426,780 B2 | 9/2008 | Lotfi et al. | |
| 7,434,306 B2 | 10/2008 | Gardner | |
| 7,462,317 B2 | 12/2008 | Lotfi et al. | |
| 7,498,522 B2 | 3/2009 | Itoh | |
| 7,521,907 B2 | 4/2009 | Cervera et al. | |
| 7,544,995 B2 | 6/2009 | Lotfi et al. | |
| 7,642,762 B2 | 1/2010 | Xie et al. | |
| 7,688,172 B2 | 3/2010 | Lotfi et al. | |
| 7,786,837 B2 | 8/2010 | Hebert | |
| 7,791,440 B2 | 9/2010 | Ramadan et al. | |
| 7,876,572 B2 | 1/2011 | Sota | |
| 7,920,042 B2 | 4/2011 | Lotfi et al. | |
| 7,936,160 B1 | 5/2011 | Sheehan | |
| 7,948,772 B2 | 5/2011 | Tung et al. | |
| 7,952,459 B2 | 5/2011 | Lotfi et al. | |
| 7,955,868 B2 | 6/2011 | Lotfi et al. | |
| 7,974,103 B2 | 7/2011 | Lim et al. | |
| 8,018,315 B2 | 9/2011 | Lotfi et al. | |
| 8,153,473 B2 | 4/2012 | Lotfi et al. | |
| 8,266,793 B2 | 9/2012 | Lotfi et al. | |
| 8,339,802 B2 | 12/2012 | Lotfi et al. | |
| 2001/0030595 A1 | 10/2001 | Hamatani et al. | |
| 2001/0033015 A1 | 10/2001 | Corisis | |
| 2001/0041384 A1 | 11/2001 | Ohgiyama et al. | |
| 2002/0153258 A1 | 10/2002 | Filas et al. | |
| 2003/0002265 A1 | 1/2003 | Simmons | |
| 2003/0062541 A1* | 4/2003 | Warner | 257/200 |
| 2003/0076662 A1 | 4/2003 | Miehling | |
| 2003/0232196 A1 | 12/2003 | Anand et al. | |
| 2004/0130428 A1 | 7/2004 | Mignano et al. | |
| 2004/0150500 A1 | 8/2004 | Kiko | |
| 2005/0011672 A1* | 1/2005 | Alawani et al. | 174/260 |
| 2005/0103112 A1 | 5/2005 | Pedersen et al. | |
| 2005/0167756 A1 | 8/2005 | Lotfi et al. | |
| 2005/0168203 A1 | 8/2005 | Dwarakanath et al. | |
| 2005/0168205 A1 | 8/2005 | Dwarakanath et al. | |
| 2005/0169024 A1 | 8/2005 | Dwarakanath et al. | |
| 2005/0212132 A1* | 9/2005 | Hsuan et al. | 257/738 |
| 2006/0009023 A1 | 1/2006 | Nair et al. | |
| 2006/0038225 A1 | 2/2006 | Lotfi et al. | |
| 2006/0040449 A1 | 2/2006 | Lotfi et al. | |
| 2006/0040452 A1 | 2/2006 | Lotfi et al. | |
| 2006/0081937 A1 | 4/2006 | Lotfi et al. | |
| 2006/0096087 A1 | 5/2006 | Lotfi et al. | |
| 2006/0096088 A1 | 5/2006 | Lotfi et al. | |
| 2006/0097831 A1 | 5/2006 | Lotfi et al. | |
| 2006/0097832 A1 | 5/2006 | Lotfi et al. | |
| 2006/0097833 A1 | 5/2006 | Lotfi et al. | |
| 2006/0109072 A1 | 5/2006 | Giandalia et al. | |
| 2006/0145800 A1 | 7/2006 | Dadafshar et al. | |
| 2006/0197207 A1* | 9/2006 | Chow et al. | 257/686 |
| 2007/0025092 A1 | 2/2007 | Lee et al. | |
| 2007/0074386 A1 | 4/2007 | Lotfi et al. | |
| 2007/0075815 A1 | 4/2007 | Lotfi et al. | |
| 2007/0075816 A1 | 4/2007 | Lotfi et al. | |
| 2007/0075817 A1 | 4/2007 | Lotfi et al. | |
| 2007/0210777 A1 | 9/2007 | Cervera et al. | |
| 2007/0246808 A1* | 10/2007 | Ewe et al. | 257/668 |
| 2008/0001701 A1 | 1/2008 | Gardner et al. | |
| 2008/0090079 A1 | 4/2008 | Fajardo et al. | |
| 2008/0180075 A1 | 7/2008 | Xie et al. | |
| 2008/0258274 A1 | 10/2008 | Sinaga et al. | |
| 2008/0258278 A1* | 10/2008 | Ramos et al. | 257/676 |
| 2008/0301929 A1 | 12/2008 | Lotfi et al. | |
| 2008/0303131 A1* | 12/2008 | McElrea et al. | 257/686 |
| 2009/0004774 A1* | 1/2009 | Lee et al. | 438/107 |
| 2009/0057822 A1* | 3/2009 | Wen et al. | 257/531 |
| 2009/0065363 A1 | 3/2009 | Liakopoulos et al. | |
| 2009/0065964 A1 | 3/2009 | Lotfi et al. | |
| 2009/0066300 A1 | 3/2009 | Lotfi et al. | |
| 2009/0066467 A1 | 3/2009 | Lotfi et al. | |
| 2009/0066468 A1 | 3/2009 | Lotfi et al. | |
| 2009/0068347 A1 | 3/2009 | Lotfi et al. | |
| 2009/0068400 A1 | 3/2009 | Lotfi et al. | |
| 2009/0068761 A1 | 3/2009 | Lotfi et al. | |
| 2009/0146297 A1 | 6/2009 | Badakere et al. | |
| 2010/0084750 A1 | 4/2010 | Lotfi et al. | |
| 2010/0087036 A1 | 4/2010 | Lotfi et al. | |
| 2010/0164449 A1 | 7/2010 | Dwarakanath et al. | |
| 2010/0164650 A1 | 7/2010 | Abou-Alfotouh et al. | |
| 2010/0176905 A1 | 7/2010 | Lotfi et al. | |
| 2010/0212150 A1 | 8/2010 | Lotfi et al. | |
| 2010/0214746 A1 | 8/2010 | Lotfi et al. | |
| 2011/0181383 A1 | 7/2011 | Lotfi et al. | |

FOREIGN PATENT DOCUMENTS

| | | |
|---|---|---|
| JP | 6-251958 | 9/1980 |
| JP | 01072517 | 3/1989 |
| JP | 1072517 A | 3/1989 |
| JP | 2-228013 A | 9/1990 |
| JP | 402228013 A | 9/1990 |
| JP | 5-314885 | 11/1993 |
| JP | 06-251958 A | 9/1994 |

OTHER PUBLICATIONS

Goodman, J., et al., "An Energy/Security Scalable Encryption Processor Using an Embedded Variable Voltage DC/DC Converter," IEEE Journal of Solid-State Circuits, Nov. 1998, pp. 1799-1809, vol. 33, No. 11, IEEE, Los Alamitos, CA.

Horowitz, P., et al., "The Art of Electronics," Second Edition, 1989, Chapter 5: Active Filters and Oscillators, pp. 288-291, Cambridge University Press, Cambridge, MA.

Lotfi, A.W., et al., "Issues and Advances in High-Frequency Magnetics for Switching Power Supplies," Proceedings of the IEEE, Jun. 2001, pp. 833-845, vol. 89, No. 6, IEEE, Los Alamitos, CA.

Sato, M., et al., "Influences of Molding Conditions on Die-pad Behavior in IC Encapsulation Process Analyzed by Hall Element Method," IEEE Transactions on Advanced Packaging, Aug. 2000, pp. 574-581, vol. 23, No. 3, IEEE, Los Alamitos, CA.

"Technical Specification: PMF 8000 Series: POL Regulator, Input 10.8-13.2 V, Output 10 A/55 W," EN/LZT 146 318 R1C, Sep. 2006, pp. 1-47, Ericsson Power Modules AB, Stockholm, Sweden.

* cited by examiner

MODULE HAVING A STACKED PASSIVE ELEMENT AND METHOD OF FORMING THE SAME

TECHNICAL FIELD

The present invention is directed, in general, to electronic devices and, in particular, to a stacked passive element in a module, and related methods of forming the same.

BACKGROUND

Magnetic devices such as inductors are often used in circuit design for electronic devices (e.g., power modules) in which energy is stored in a magnetic field surrounding an electrically conductive element such as a coil of copper wire. To produce an inductor that can store a useful amount of energy for a given size and a given current level, a number of electrically conductive turns or wires are formed around a magnetic structure or core such as a layer of magnetic material. The magnetic field is enhanced by the permeability of the magnetic material and by the presence of the multiple conductive turns. As the size of electronic devices has been reduced by using integrated circuits and printed wiring boards with surface-mount assembly techniques, the size of inductors has not, to date, decreased proportionately. Thus, the size of magnetic structures generally dominates the size of present electronic power modules.

Substantial progress has been made in recent years in integrating control circuits including operational amplifiers, comparators, and passive circuit elements, with active elements such as field-effect transistors. An area that has been more challenging is to produce a power module that includes larger passive elements, such as inductors, that are difficult to include in an integrated circuit, with an active element that may include control circuit elements and passive elements such as resistors on the same die. The integration of larger passive elements such as inductors with an active element would enable the production of very compact power modules.

A characteristic that affects broad market acceptance of a power module is its physical size, which introduces thermal design challenges. A continuing area affecting the design of a compact power module that requires further progress is the ability to dissipate the heat produced by passive circuit elements in a compact physical structure, as well as the heat produced by active elements. The dissipation of heat from these sources is performed in a challenging external thermal environment without compromising a power rating of the power module.

A number of approaches have been used in the past to reduce the size of a power module. For instance, U.S. Pat. No. 5,574,420 entitled "Low Profile Surface Mounted Magnetic Devices and Components Therefor," to Roy, et al., issued Nov. 12, 1996, which is incorporated herein by reference, discloses a magnetic device that forms conductive pathways in a body of magnetic material, adds windings by inserting staple-like conductive piece parts through apertures in the body, and solders the staples to a patterned printed wiring board placed below a ceramic magnetic bar to complete the winding structure. Each of the magnetic devices disclosed in the aforementioned references suffers from a current limitation therefor, which is an impractical design and manufacturing approach for a mass market. The aforementioned magnetic devices also provide inadequate heat dissipation capability or reduction in the size thereof.

Another approach is disclosed in a technical specification from Ericsson designated "EN/LZT 146 318 R1C," September 2006 for PMF 8000 series point of load ("POL") regulators, which is incorporated herein by reference. As illustrated on the first page of the technical specification, the PMF 8000 series POL regulators provides a magnetic component of large size and discrete implementation without any heat removal capability causing an inadequate ability to shrink the size of the device or remove heat therefrom. Another approach is disclosed in U.S. Pat. No. 6,366,486 entitled "Power Supply Device for Enhancing Heat-Dissipating Effect," to Chen, et al. ("Chen"), issued Apr. 2, 2002, which is incorporated herein by reference. A package of Chen includes a printed circuit board, a transformer, an inductor having an inductive winding, a metal strip electrically connected to the inductive winding, and a converter electrically connected to the metal strip and covered by the metal strip. The aforementioned magnetic device also provides inadequate heat dissipation capability or reduction in the size of a power module.

Thus, the designs for power modules of the past are inadequate to produce a sufficiently miniaturized, high-density device with a substantial power rating. The power modules should be more compact than presently achievable designs. The design of power modules is inadequately served by these aforementioned limitations. In addition, a power module integrable with manufacturing processes of a commensurate end product would provide substantial cost savings therefor.

Accordingly, what is needed in the art is a power module, and related method of forming the same, that can meet the more stringent requirements of present applications such as compactness, efficiency and high power density, while being manufacturable at high volume and with lower cost than is achieved with conventional design approaches.

SUMMARY OF THE INVENTION

These and other problems are generally solved or circumvented, and technical advantages are generally achieved, by advantageous embodiments of the present invention, which include a module having a discrete passive element and a semiconductor device, and method of forming the same. In one embodiment, the module (e.g., a power module) includes a patterned leadframe, a discrete passive element (e.g., a discrete magnetic device) mounted on an upper surface of the leadframe, and a thermally conductive, electrically insulating material formed on an upper surface of the discrete passive element. The module also includes a semiconductor device bonded to an upper surface of the thermally conductive, electrically insulating material.

In another aspect, the present invention provides a method of forming a module (e.g., a power module). The method includes providing a patterned leadframe, mounting a discrete passive element (e.g., a discrete magnetic device) on an upper surface of the leadframe, and forming a thermally conductive, electrically insulating material on an upper surface of the discrete passive element. The method also includes bonding a semiconductor device to an upper surface of the thermally conductive, electrically insulating material.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely, a power module (e.g., an electronic device) including a discrete or separate passive element and a semiconductor device, and a method of manufacture therefor. While the principles of the present invention will be described in the environment of a power module, any application that may benefit from a semiconductor device mounted on a discrete passive element as described herein is well within the broad scope of the present invention.

As will become more apparent, a discrete passive element may be embodied, without limitation, in an inductor or a transformer. In addition, a semiconductor device may include active elements (e.g., a switch) and passive elements (e.g., diodes, resistors, capacitors) and circuits such as controllers with control circuit elements such as operational amplifiers and comparators. Of course, the broad scope of the present invention is not limited to the particular elements that form the semiconductor device.

In addition to the passive and active elements, the semiconductor device may include integrated circuits (either in bare die or in module form) coupled (e.g., adhesively mounted) to a conductive substrate (e.g., a leadframe), and electrically coupled thereto with wire bonds, as well as surface-mount elements coupled thereon. An encapsulant such as plastic molded material, for example, an epoxy material, is placed around the discrete passive element and the semiconductor device, and any additional elements to provide environmental and mechanical protection as well as a thermally conductive covering to facilitate heat dissipation during operation of the power module. Other molding materials and processes as well as electronic devices constructed without an encapsulant are well within the broad scope of the present invention. It should be understood that the power module may form, at least in part, a power management system, which itself is often referred to as a power management integrated circuit.

Figure 1:
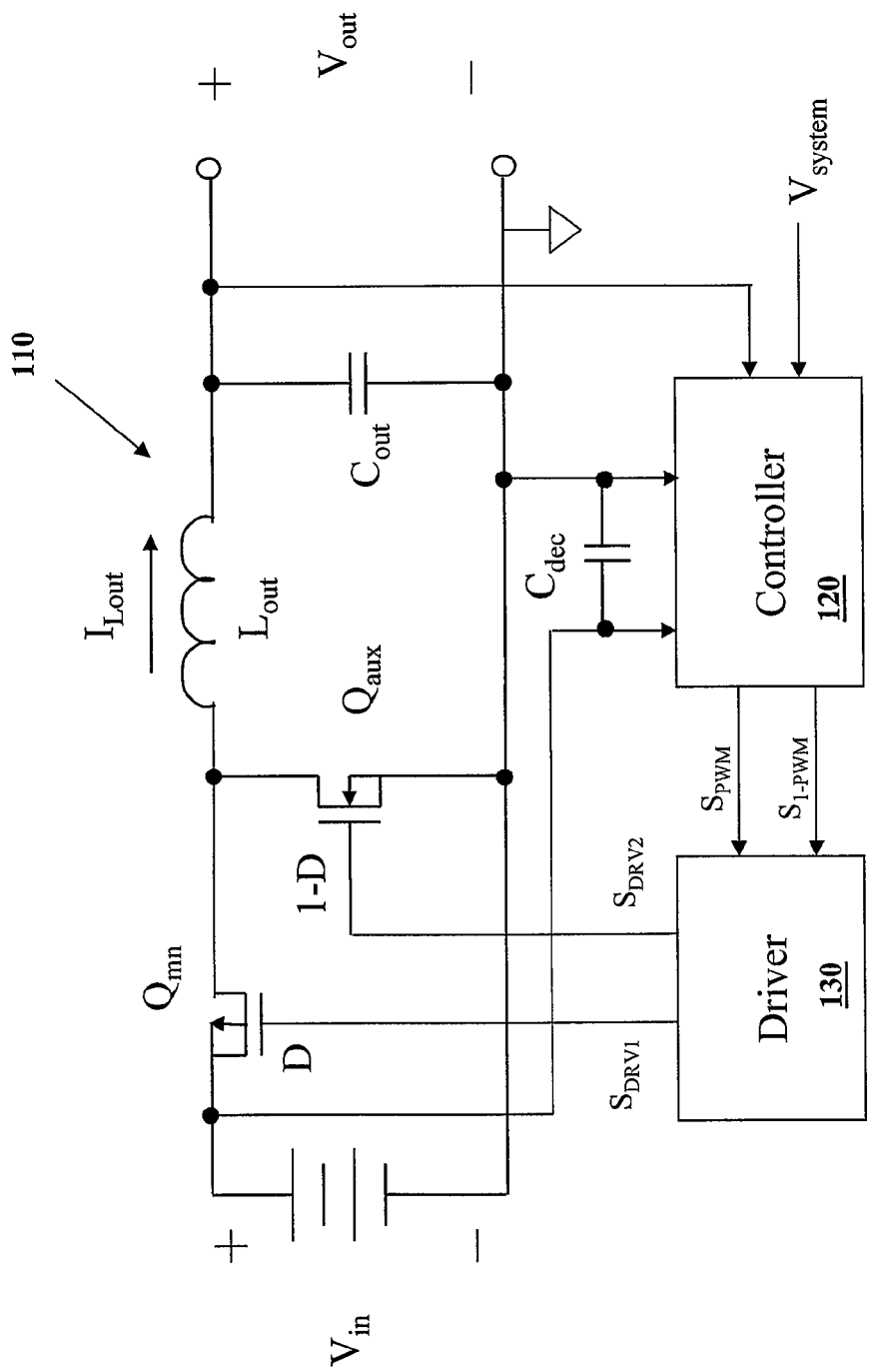
FIG. 1 illustrates a schematic diagram of an embodiment of a power converter including power conversion circuitry employable in a power module constructed according to the principles of the present invention.

Referring initially to FIG. 1, illustrated is a schematic diagram of an embodiment of a power converter including power conversion circuitry employable in a power module constructed according to the principles of the present invention. The power converter includes a power train 110, a controller 120 and a driver 130 including control circuit elements, and provides power to a system such as a microprocessor. While in the illustrated embodiment, the power train 110 employs a buck converter topology, those skilled in the art should understand that other converter topologies such as a forward converter topology are well within the broad scope of the present invention.

The power train 110 receives an input voltage $V_{in}$ from a source of electrical power (represented by a battery) at an input thereof and provides a regulated output voltage $V_{out}$ to power, for instance, a microprocessor at an output thereof. In keeping with the principles of a buck converter topology, the output voltage $V_{out}$ is generally less than the input voltage $V_{in}$ such that a switching operation of the power converter can regulate the output voltage $V_{out}$. An active element such as a switch (e.g., a main switch $Q_{mn}$) is enabled to conduct for a primary interval (generally co-existent with a primary duty cycle "D" of the main switch $Q_{mn}$) and couples the input voltage $V_{in}$ to an output filter inductor $L_{out}$. During the primary interval, an inductor current $I_{Lout}$ flowing through the output filter inductor $L_{out}$ increases as a current flows from the input to the output of the power train 110. A portion of the inductor current $I_{Lout}$ is filtered by the output capacitor $C_{out}$.

During a complementary interval (generally co-existent with a complementary duty cycle "1-D" of the main switch $Q_{mn}$), the main switch $Q_{mn}$ is transitioned to a non-conducting state and another active element such as another switch (e.g., an auxiliary switch $Q_{aux}$) is enabled to conduct. The auxiliary switch $Q_{aux}$ provides a path to maintain a continuity of the inductor current $I_{Lout}$ flowing through the output filter inductor $L_{out}$. During the complementary interval, the inductor current $I_{Lout}$ through the output filter inductor $L_{out}$ decreases. In general, the duty cycle of the main and auxiliary switches $Q_{mn}$, $Q_{aux}$ may be adjusted to maintain a regulation of the output voltage $V_{out}$ of the power converter. Those skilled in the art should understand, however, that the conduction periods for the main and auxiliary switches $Q_{mn}$, $Q_{aux}$ may be separated by a small time interval to avoid cross conduction therebetween and beneficially to reduce the switching losses associated with the power converter.

The controller 120 receives a desired characteristic such as a desired system voltage $V_{system}$ from an internal or external source associated with the microprocessor, and the output voltage $V_{out}$ of the power converter. The controller 120 is also coupled to the input voltage $V_{in}$ of the power converter and a return lead of the source of electrical power (again, represented by a battery) to provide a ground connection therefor. A decoupling capacitor $C_{dec}$ is coupled to the path from the input voltage $V_{in}$ to the controller 120. The decoupling capacitor $C_{dec}$ is configured to absorb high frequency noise signals associated with the source of electrical power to protect the controller 120.

In accordance with the aforementioned characteristics, the controller 120 provides a signal (e.g., a pulse width modulated signal $S_{PWM}$) to control a duty cycle and a frequency of the main and auxiliary switches $Q_{mn}$, $Q_{aux}$ of the power train 110 to regulate the output voltage $V_{out}$ thereof. The controller 120 may also provide a complement of the signal (e.g., a complementary pulse width modulated signal $S_{1\text{-}PWM}$) in accordance with the aforementioned characteristics. Any controller adapted to control at least one switch of the power converter is well within the broad scope of the present invention. As an example, a controller employing digital circuitry is disclosed in U.S. Pat. No. 7,038,438, entitled "Controller for a Power Converter and a Method of Controlling a Switch Thereof," to Dwarakanath, et al. and U.S. Pat. No. 7,019,505, entitled "Digital Controller for a Power Converter Employing Selectable Phases of a Clock Signal," to Dwarakanath, et al., which are incorporated herein by reference.

The power converter also includes the driver 130 configured to provide drive signals $S_{DRV1}$, $S_{DRV2}$ to the main and auxiliary switches $Q_{mn}$, $Q_{aux}$, respectively, based on the signals $S_{PWM}$, $S_{1\text{-}PWM}$ provided by the controller 120. There are a number of viable alternatives to implement a driver 130 that include techniques to provide sufficient signal delays to prevent crosscurrents when controlling multiple switches in the power converter. The driver 130 typically includes active elements such as switching circuitry incorporating a plurality of driver switches that cooperate to provide the drive signals $S_{DRV1}$, $S_{DRV2}$ to the main and auxiliary switches $Q_{mn}$, $Q_{aux}$. Of course, any driver 130 capable of providing the drive signals $S_{DRV1}$, $S_{DRV2}$ to control a switch is well within the broad scope of the present invention. As an example, a driver is disclosed in U.S. Pat. No. 7,330,017, entitled "Driver for a Power Converter and Method of Driving a Switch Thereof," to Dwarakanath, et al., which is incorporated herein by reference. Also, an embodiment of a semiconductor device that may embody portions of the power conversion circuitry is disclosed in U.S. Pat. No. 7,230,302, entitled "Laterally Diffused Metal Oxide Semiconductor Device and Method of Forming the Same," to Lotfi, et al., which is incorporated herein by reference, and an embodiment of an integrated circuit embodying power conversion circuitry, or portions thereof, is disclosed in U.S. Pat. No. 7,015,544, entitled "Integrated Circuit Employable with a Power Converter," to Lotfi, et al., which is incorporated by reference.

Figure 2:
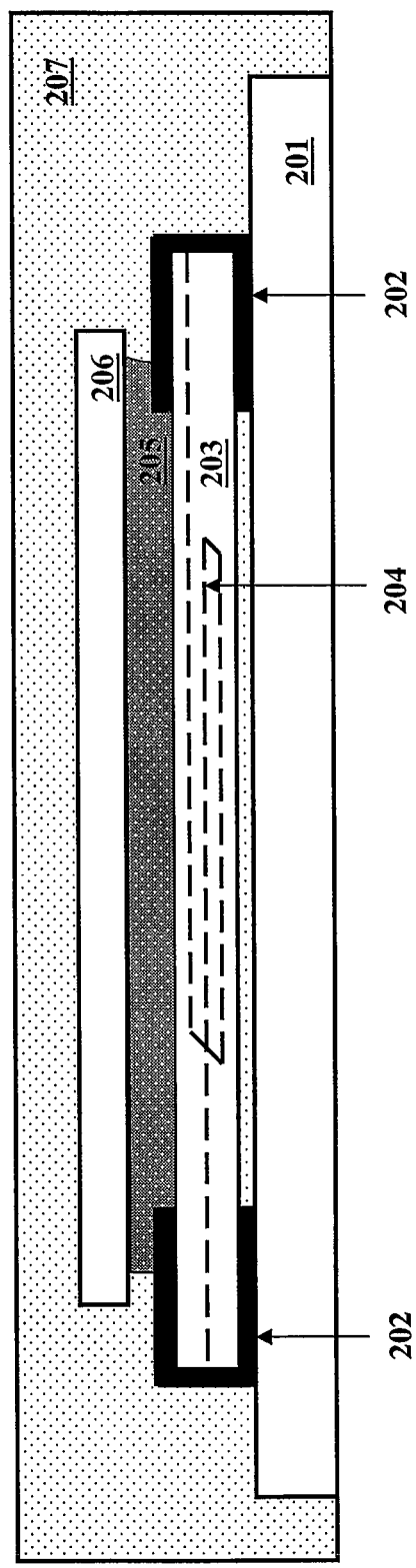
FIG. 2 illustrates an elevational view of an embodiment of a surface-mount power module formed with a discrete passive element constructed according to the principles of the present invention.

Turning now to FIG. 2, illustrated is an elevational view of an embodiment of a surface-mount power module formed with a discrete passive element, such as an inductor soldered to a leadframe 201, constructed according to the principles of the present invention. The discrete passive element includes a main body 203 that may be formed with a ceramic material with metallic ends 202 thereof. The metallic ends 202 of the main body 203 of the discrete passive element are generally tinned to enable surface-mount soldering to the leadframe 201. The discrete passive element may include a magnetic device such as an inductor formed with an electrically conductive loop 204 embedded in a magnetic material such as a soft ferrite to form the main body 203. A top surface of the metallic ends 202 of the main body 203 are generally slightly elevated from the top surface of a central portion of the main body 203 of the discrete passive element. The leadframe 201 may be formed as a patterned, conductive area of a metallic sheet such as copper foil, or as the etched upper surface of a printed wiring board, thereby forming a substrate. A typical thickness of the leadframe 201 is about eight mils. While the leadframe 201 is often constructed of copper, alternative electrically conductive materials can be used therefor. The leadframe 201 may provide external connections within and external to the power module as well as a support base for the discrete passive element.

Solder paste is selectively applied or disposed to the leadframe 201 in a thin layer to areas (e.g., a pad of the leadframe 201) for screening processes to provide electrical and mechanical attachment for surface-mount elements such as the discrete passive element. The surface-mount elements such as capacitors may be placed with their conductive ends in the solder paste. The solder paste may be composed of lead-based as well as lead-free compositions.

Above the discrete passive element, a thermally conductive and electrically insulating material 205 is dispensed thereon to form an upper planar surface that acts as a die-attach layer for a semiconductor device 206 that is adhesively bonded thereon. An exemplary thermally conductive and electrically insulating material 205 is epoxy. The adhesive is cured, typically in a controlled thermal process, to secure the semiconductor device to the discrete passive element. An exemplary thermally conductive and electrically insulating material 205 used to mount the semiconductor device 206 on to the discrete passive element is Ablebond 2025D from Ablestik, Rancho Dominguez, Calif. The thermally conductive and electrically insulating material 205 is dispensed (applied) on to the discrete passive element and the semiconductor device 206 is pressed into the thermally conductive and electrically insulating material 205 forcing spreading of the same under the semiconductor device 206 to obtain a minimum of 75% coverage of the bottom surface semiconductor device 206. A curing process in an in-line oven for up to about 45 minutes at about 175 degrees Celsius is used to cure the thermally conductive and electrically insulating material 205.

The semiconductor device 206 is electrically coupled to the patterned leadframe 201 by wire bonds (not shown). The assembly is then encapsulated in a molded package 207, preferably by a thermo-setting encapsulant material such as an epoxy molding compound from Sumikon EME-G770LC from Sumitomo Bakelite, Tokyo, Japan by a transfer molding process to form a surface-mount power module.

Electrical connections to an external circuit are made to the power module by electrically conductive pads formed about the edges of the power module as illustrated and described with reference to FIGS. 4 and 5. In an alternative embodiment, electrical connections are made to the power module by electrically conductive pads (not shown) formed on the lower surface of the power module. The power module may be electrically bonded to an external circuit such as a another circuit board or printed wiring board using reflow solder techniques in a reflow oven, as is well understood in the art. In an alternative embodiment, the power module may be formed as a through-hole mounted power module employing leads that extend from an outer surface of the power module such as from a side thereof.

In the embodiment illustrated in FIG. 2, heat produced in the semiconductor device is conducted through the thermally conductive layer 205 to the discrete passive element (e.g., through the metallic ends 202 of the main body 203), from which the heat is conducted to the leadframe 201, and then out of the power module. Heat flow is enhanced by the presence of the metallic ends 202 of the discrete passive element, recognizing the generally high thermal conductivity of metallic structures. The metallic ends 202 of the discrete passive element may be tinned as conventionally formed with a base layer of silver, a supplementary base layer of copper, an intermetallic barrier layer of nickel, followed by a solderable surface of tin.

Figure 3:
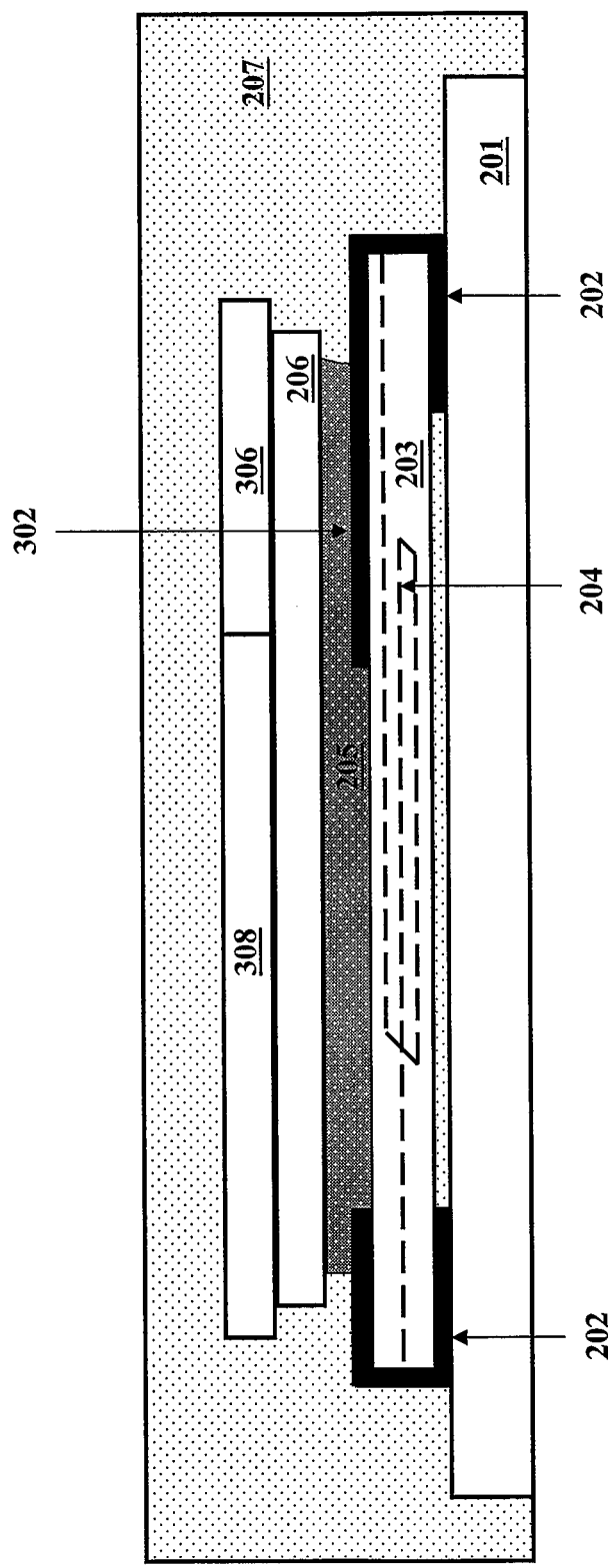
FIG. 3 illustrates an elevational view of another embodiment of a surface-mount power module formed with a discrete passive element constructed according to the principles of the present invention.

Turning now to FIG. 3, illustrated is an elevational view of an embodiment of a surface-mount power module formed with an extended metallic region 302 of a main body 203 of a discrete passive element constructed according to the principles of the present invention. For purposes of simplicity, analogous elements of the power modules of FIGS. 2 and 3 are designated with the same reference numbers. The extended metallic region 302, which may also be tinned, extends from one of the metallic ends 202 and enhances the thermal conductivity of the heat flow path from a semiconductor device to the leadframe 201, and then to the external environment of the power module. To further enhance the heat flow path, a high heat-producing region 306 of the semiconductor device, such as a field-effect transistor, is located above the extended metallic region 302. A lower heat-producing region 308 of the semiconductor device may be located above a remaining portion of the main body 203 of the discrete passive element. The remaining elements of the power module of FIG. 3 previously introduced will not be redescribed in the interest of brevity.

Figure 4:
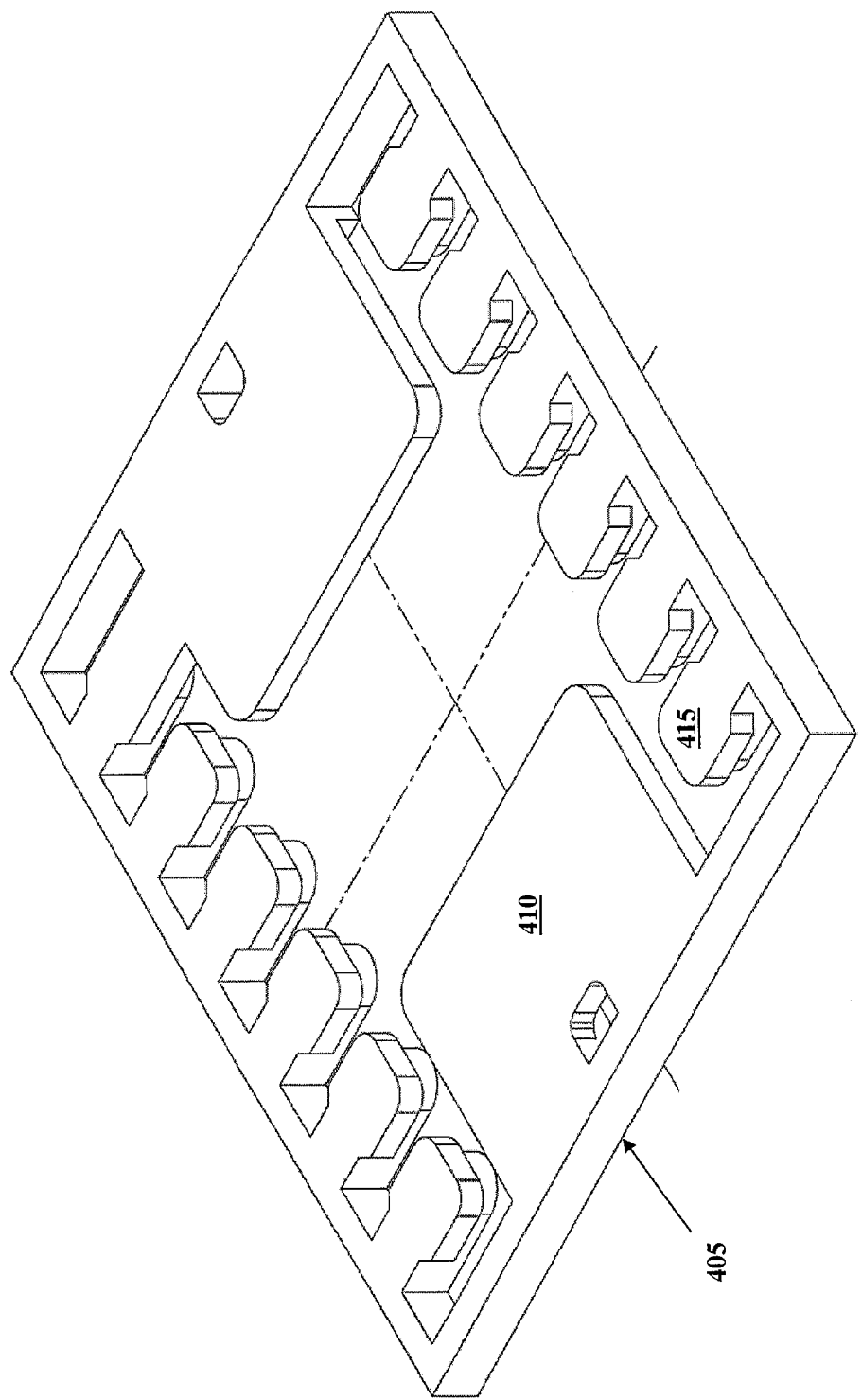
FIGS. 4 to 8 illustrate views of an embodiment of a power module at different stages of completion constructed according to the principles of the present invention.

Turning now to FIGS. 4 to 8, illustrated are views of an embodiment of a power module at different stages of completion constructed according to the principles of the present invention. Beginning with FIG. 4, illustrated is a leadframe 405 that provides the foundation for the power module. In addition to the features described above, the leadframe 405 includes a pad 410 that provides a base for a discrete passive element and leads (one of which is designated 415) that provides electrical connections for a semiconductor device located above the discrete passive element.

Figure 5:
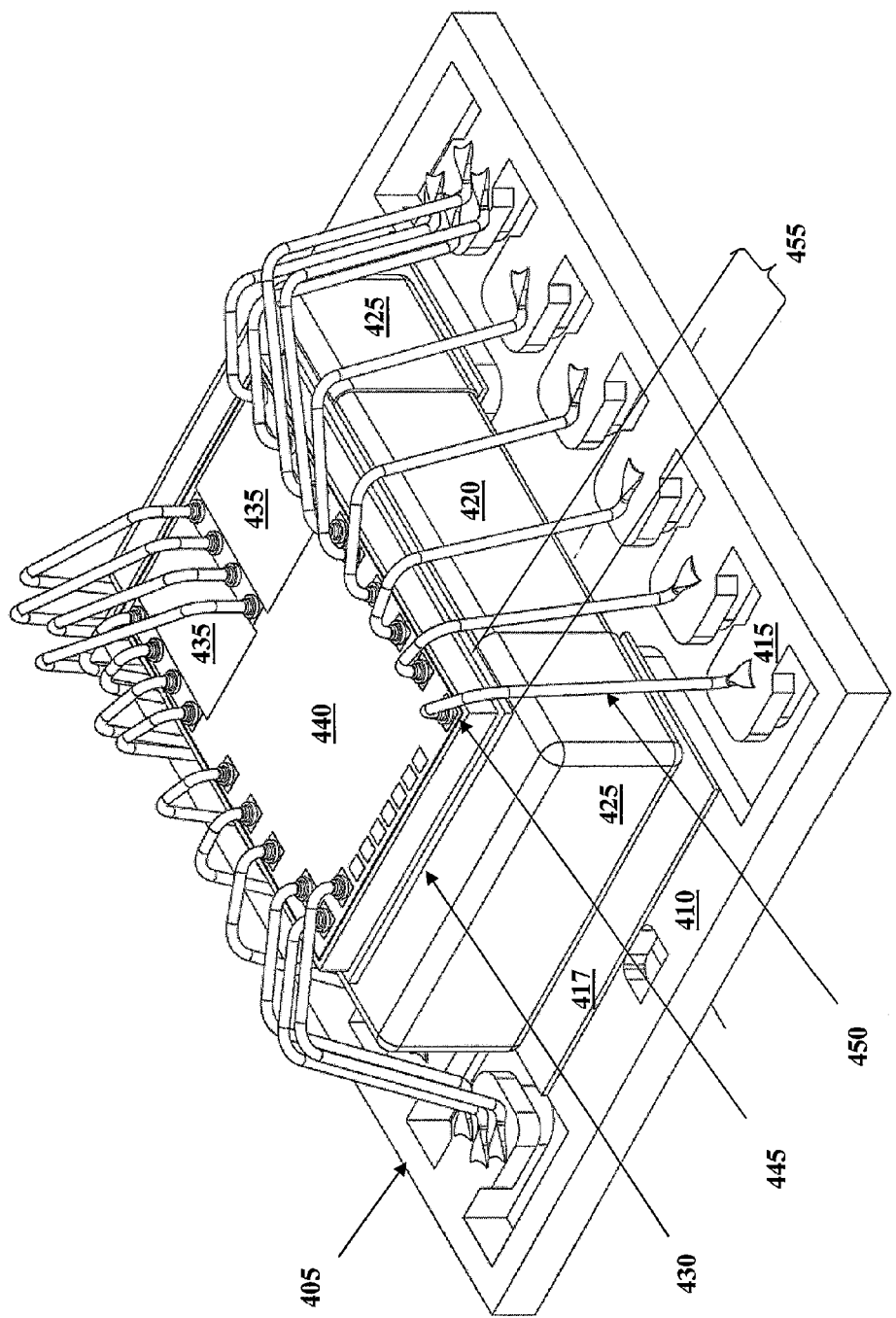

Turning now to FIG. 5, illustrated is an isometric view of an embodiment of the power module with the discrete passive element and semiconductor device constructed on the leadframe 405 of the power module. The discrete passive element includes a main body 420 with a generally planar upper surface and metallic ends 425 and is coupled to the pad 410 of the leadframe 405 via solder paste 417, which is formed on the pad 410 prior to placing the discrete passive element thereon. Above an upper surface of a portion of the discrete passive element is a thermally conductive, electrically insulating layer 430 formed with a planar upper surface.

The semiconductor device formed as an unpackaged semiconductor die includes switches (e.g., metal-oxide semiconductor field-effect transistors) 435 and a controller 440 and is bonded to the upper surface of the thermally conductive, electrically insulating layer 430. Pads, such as pad 445, on an upper surface of the semiconductor device are coupled by wire bonds, such as wire bond 450, to the electrically conductive leads 415 formed on the leadframe 405. The wire bonds 450 are preferably formed of gold wire to provide electrical circuit connections between the pads 445 on the upper surface of the semiconductor device and the electrically conductive leads 415 formed on the leadframe 405. Thermal conductivity of the heat path from the semiconductor device through the thermally conductive, electrically insulating layer 430 is enhanced by an overlapping region 455 of the semiconductor device with the metallic ends 425 of the main body 420 of the discrete passive element. Advantageously, high heat dissipating portions of the semiconductor device are located over or near an overlapping region such as overlapping region 455.

The steps as described above to form a power module generally do not require execution in the highly controlled environment of a clean room. Some steps, however, may be preferably performed in a clean room or other controlled environment such as typically used for assembly of integrated circuits into a molded plastic package, as is generally well known in the art.

Figure 6:
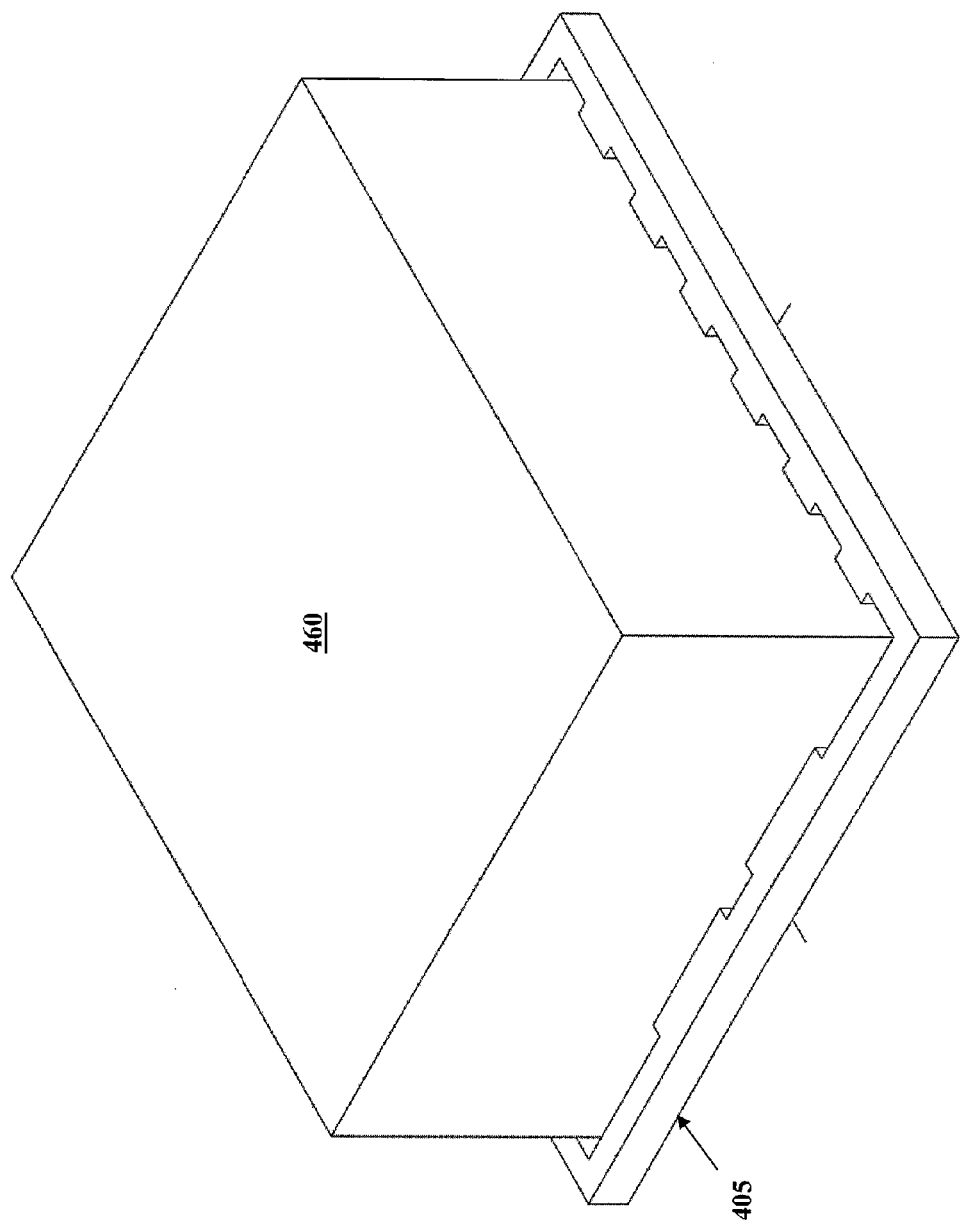

Turning now to FIG. 6, illustrated is an isometric view of an embodiment of the power module after encapsulation by transfer molding with an encapsulant 460 such as an epoxy material constructed according to the principles of the present invention. The ends of the leadframe 405 are exposed about the encapsulant 460 with the electrically conductive leads (not shown) for contact to another circuit board, printed wiring board, substrate or the like.

Figure 7:
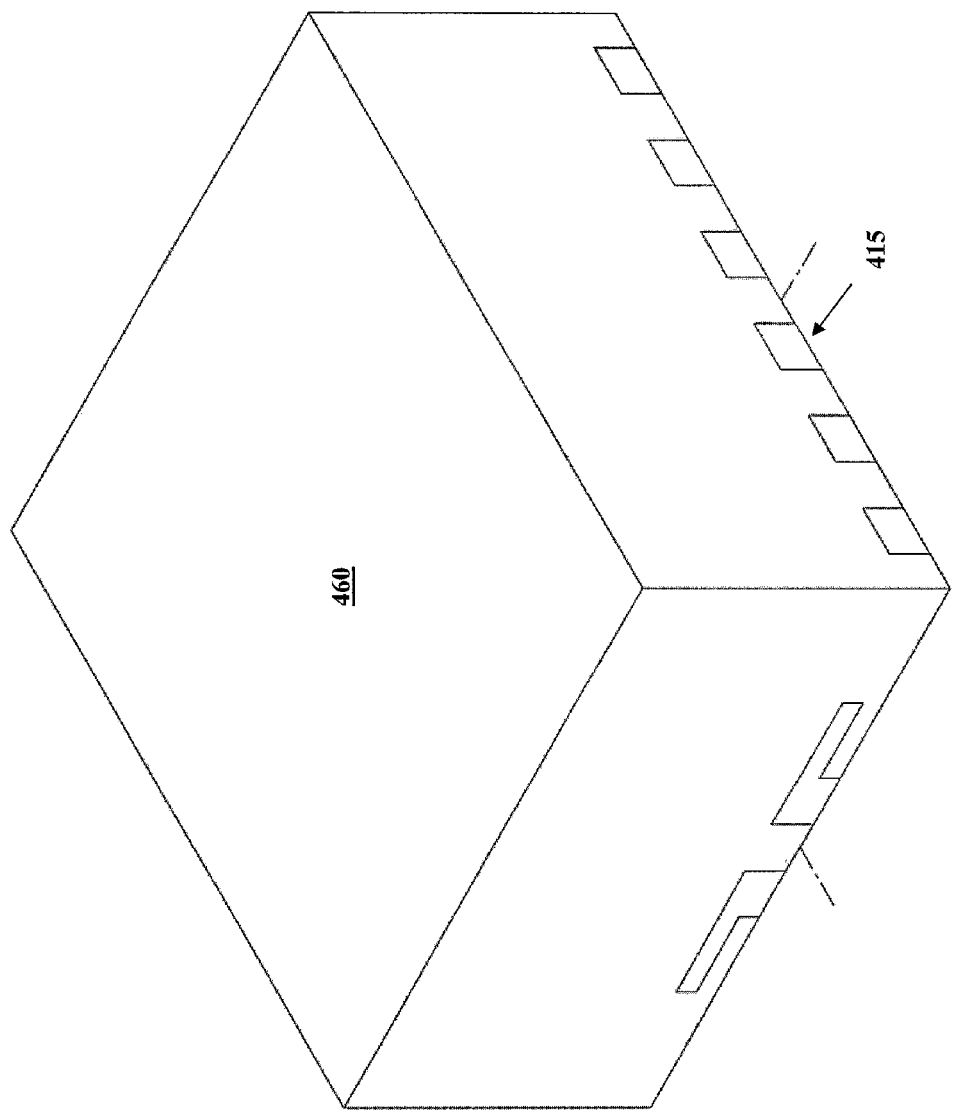
Figure 8:
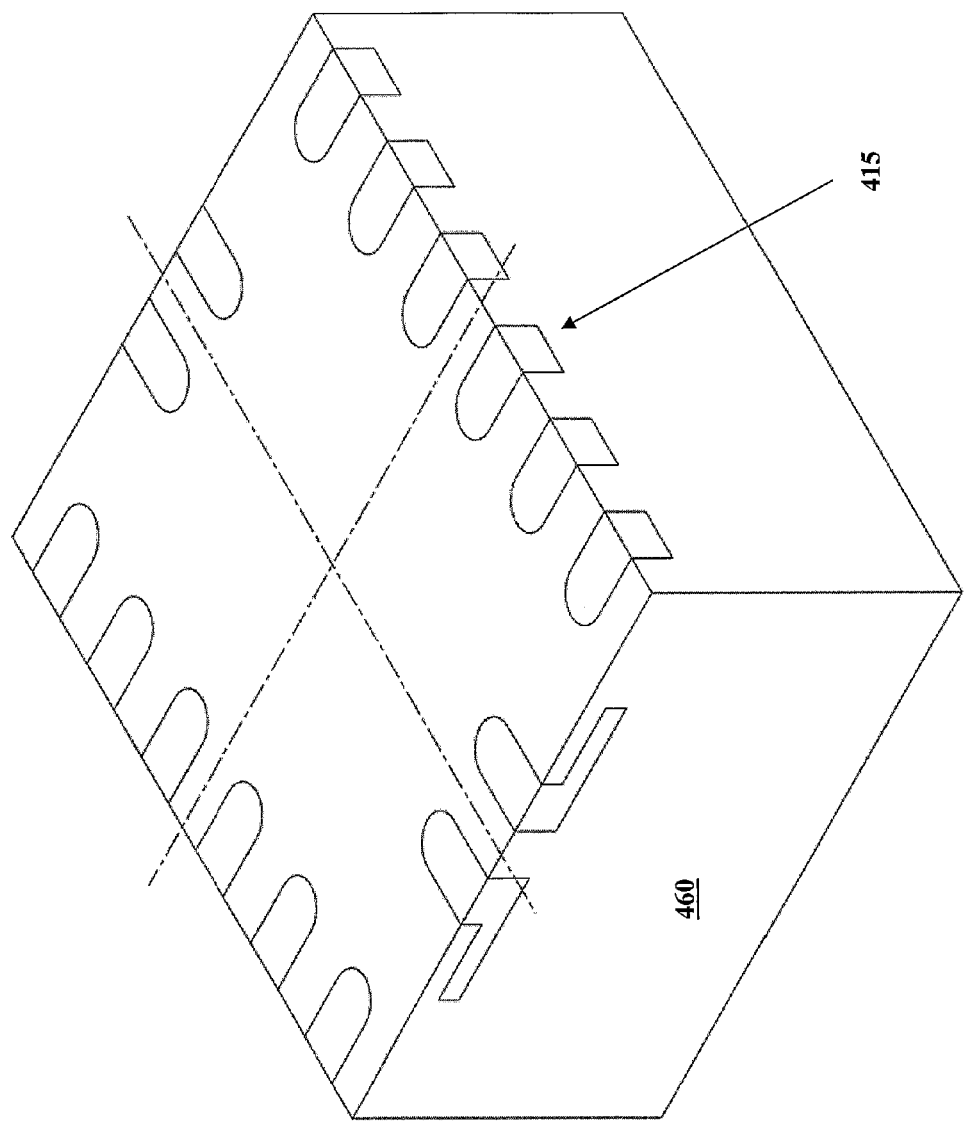

Turning now to FIGS. 7 and 8, illustrated are isometric views of an embodiment of the power module after the ends of the leadframe (not shown) have been removed (such as by sawing) in accordance with the principles of the present invention. The electrically conductive leads or contacts 415 are disposed along the outer edges (see FIG. 7) and lower edges (see FIG. 8) of the power module to enable the power module to be reflow soldered to a printed wiring board in an end product. Typically, the electrically conductive leads or contacts 415 are substantially coplanar with the sides and lower surface of the power module and provide electrical connectivity to an external circuit.

Electrical connections of the power module to the system employing the power module are made by placing the power module on another circuit board or printed wiring board formed with interconnect pads that are covered with solder paste, generally by a screening operation, and heating the power module on the circuit board in a reflow oven. The reflow soldering operation is generally adequate to provide mechanical attachment of the power module to another circuit board, but other attachment methods such as adhesive compound are well within the broad scope of the present invention.

The exemplary lateral dimensions of the power module as illustrated in FIGS. 4 to 8 are 2.5 millimeters ("mm")×2.25 mm. The height of the module is 1.1 mm. A power module of these dimensions can produce an output current of 1 amperes at 3.3 volts, resulting in a power conversion density of 0.53 watts/cubic-mm ("W/mm$^3$"). Of course, the broad scope of the present invention is not limited to a power module, power converter or the like, having the aforementioned dimensions and ratings, and may be applicable to other electronic devices as well.

Thus, a power module and a method of manufacture thereof with readily attainable and quantifiable advantages have been introduced. Those skilled in the art should understand that the previously described embodiments of the power module are submitted for illustrative purposes only. In addition, other embodiments capable of producing a power module while addressing compact, efficient, and high density power modules, while being manufacturable at high volume and with lower cost than is achieved with the prior art are well within the broad scope of the present invention. While the power module has been described in the environment of electronic power conversion, the device may also be incorporated into other electronic devices, systems or assemblies such as entertainment, motor control, or computing devices, or into other devices wherein a compact module is required that can be assembled advantageously at low cost.

For a better understanding of power converters, see "Modern DC-to-DC Switchmode Power Converter Circuits," by Rudolph P. Severns and Gordon Bloom, Van Nostrand Reinhold Company, New York, N.Y. (1985) and "Principles of Power Electronics," by J. G. Kassakian, M. F. Schlecht and G. C. Verghese, Addison-Wesley (1991). For a better understanding of magnetic devices, see "Soft Ferrites: Properties and Applications," by E. C. Snelling, published by Butterworth-Heinemann, Second Edition, 1989. The aforementioned references are incorporated herein by reference in their entirety.

Also, although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A module, comprising:
    a patterned leadframe;
    a discrete passive element mounted on an upper surface of said leadframe including a main body, planar metallic ends formed on and about ends of said main body extending laterally on an upper surface and a lower surface thereof, and a planar extended metallic region extending from one end of one of said planar metallic ends formed on said upper surface of said discrete passive element beyond said one of said planar metallic ends on said lower surface of said discrete passive element and positioned to provide a heat flow path from a semiconductor device positioned above said discrete passive element to said leadframe, said planar metallic ends including at least one of a base layer, an intermetallic barrier layer and a solderable surface; and
    a thermally conductive, electrically insulating material formed on said planar extended metallic region and a portion of said upper surface of said discrete passive element, wherein said semiconductor device is bonded to an upper surface of said thermally conductive, electrically insulating material and includes a higher heat-producing region located above said planar extended metallic region.

2. The module as recited in claim 1 wherein said semiconductor device includes a lower heat-producing region located above said main body of said discrete passive element.

3. The module as recited in claim 1 wherein said base layer includes silver, said intermetallic barrier layer includes nickel and said solderable surface includes tin.

4. The module as recited in claim 1 wherein said discrete passive element comprises another planar extended metallic region extending from another one of said planar metallic ends on said upper surface of said discrete passive element.

5. The module as recited in claim 1 wherein an active element of said semiconductor device is positioned at least partially over one of said planar metallic ends of said discrete passive element.

6. The module as recited in claim 1 wherein said discrete passive element is mounted on a pad on said upper surface of said leadframe.

7. The module as recited in claim 1 wherein said discrete passive element is mounted via solder paste on a pad on said upper surface of said leadframe.

8. The module as recited in claim 1 wherein said semiconductor device is wire bonded to a lead on said leadframe.

9. The module as recited in claim 1 wherein said semiconductor device is coupled to a lead on said leadframe and said lead provides electrical connectivity to an external circuit.

10. The module as recited in claim 1 further comprising an encapsulant about said leadframe, said discrete passive element and said semiconductor device.

11. A power module, comprising:
    a patterned leadframe;
    a discrete magnetic device mounted on an upper surface of said leadframe including a main body, planar metallic ends formed on and about ends of said main body extending laterally on an upper surface and a lower surface thereof, and a planar extended metallic region extending from one end of one of said planar metallic ends formed on said upper surface of said discrete magnetic device beyond said one of said planar metallic ends on said lower surface of said discrete magnetic device and positioned to provide a heat flow path from a semiconductor device positioned above said discrete magnetic device to said leadframe, said planar metallic ends including at least one of a base layer, an intermetallic barrier layer and a solderable surface; and;
    a thermally conductive, electrically insulating material formed on said planar extended metallic region and a portion of said upper surface of said discrete magnetic device, wherein said semiconductor device is bonded to an upper surface of said thermally conductive, electrically insulating material and includes a higher heat-producing region located above said planar extended metallic region.

12. The power module as recited in claim 11 wherein said semiconductor device includes lower heat-producing region located above said main body of said discrete passive element.

13. The power module as recited in claim 11 wherein said base layer includes silver, said intermetallic barrier layer includes nickel and said solderable surface includes tin.

14. The power module as recited in claim 11 wherein said discrete magnetic device comprises another planar extended metallic region extending from another one of said planar metallic ends on said upper surface of said discrete magnetic device.

15. The power module as recited in claim 11 wherein an active element of said semiconductor device is positioned at least partially over one of said planar metallic ends of said discrete magnetic device.

16. The power module as recited in claim 11 wherein said discrete magnetic device is mounted on a pad on said upper surface of said leadframe.

17. The power module as recited in claim 11 wherein said discrete magnetic device is mounted via solder paste on a pad on said upper surface of said leadframe.

18. The power module as recited in claim 11 wherein said semiconductor device is wire bonded to a lead on said leadframe.

19. The power module as recited in claim 11 wherein said semiconductor device is coupled to a lead on said leadframe and said lead provides electrical connectivity to an external circuit.

20. The power module as recited in claim 11 further comprising an encapsulant about said leadframe, said discrete magnetic device and said semiconductor device.

* * * * *